United States Patent [19]

Contiero et al.

[11] Patent Number: 5,126,911
[45] Date of Patent: * Jun. 30, 1992

[54] INTEGRATED CIRCUIT SELF-PROTECTED AGAINST REVERSAL OF THE SUPPLY BATTERY POLARITY

[75] Inventors: Claudio Contiero, Buccinasco; Bruno Murari, Monza, both of Italy

[73] Assignee: SGS-Thomson Microelectronics, s.r.l., Milan, Italy

[*] Notice: The portion of the term of this patent subsequent to Sep. 18, 2007 has been disclaimed.

[21] Appl. No.: 385,721

[22] Filed: Jul. 26, 1989

[30] Foreign Application Priority Data

Sep. 27, 1988 [IT] Italy ................ 22085 A/88

[51] Int. Cl.$^5$ ............................... H02H 3/18
[52] U.S. Cl. ................. 361/84; 307/127; 361/92; 357/23.13
[58] Field of Search ........... 361/84, 92, 88, 90, 361/56, 18, 111, 91, 77; 357/23.13, 42, 23.4; 307/127

[56] References Cited

U.S. PATENT DOCUMENTS

| | | | |
|---|---|---|---|
| 3,712,995 | 1/1973 | Steudel | 361/56 |
| 3,829,709 | 8/1974 | Maigret et al. | 307/202 |
| 3,940,785 | 2/1976 | Genesi | 357/48 |
| 4,423,456 | 12/1983 | Zaidenweber | 361/77 |
| 4,589,004 | 5/1986 | Yasuda et al. | 357/23.4 |
| 4,698,582 | 10/1987 | Braun et al. | 361/86 |
| 4,858,055 | 8/1989 | Okitaka | 361/91 |
| 4,958,251 | 9/1990 | Cini et al. | 361/84 |
| 5,027,250 | 1/1991 | Cini et al. | 361/90 |

FOREIGN PATENT DOCUMENTS 3133518 3/1983 France ................ 361/84

OTHER PUBLICATIONS

Patent Abstracts of Japan vol. 13, No. 8 (E-702) (3356) Jan. 10, 1989.

*Primary Examiner*—A. D. Pellinen
*Assistant Examiner*—C. S. Schultz
*Attorney, Agent, or Firm*—Rosen, Dainow & Jacobs

[57] ABSTRACT

An integrated circuit self-protected against a reversal of its supply battery polarity comprises a first DMOS power transistor connected with its source electrode side to an electric load to be driven toward ground, and a second, protective DMOS transistor which is connected with its source electrode side to a positive pole of the battery and with its drain electrode side to the drain electrode of the first transistor. The first and second transistors have in common the drain region formed on a single pod in the semiconductor substrate.

9 Claims, 4 Drawing Sheets

INTEGRATED CIRCUIT SELF-PROTECTED AGAINST REVERSAL OF THE SUPPLY BATTERY POLARITY

This invention relates to an integrated circuit self-protected against reversal of the supply battery polarity.

As is well known, on car assembly lines, the storage battery for the car electric system is customarily installed in each car toward the end of the assembly and installation steps of the electric system and utilities connected thereto.

The several electric loads represented by lights, actuators, and the like items, are usually driven between a positive supply pole and ground, with the intermediary of an electronic control circuit.

Since it may occur that the power supply cables to such electronic circuits in the system are inverted accidentally, there exists a need to accept fortuitous reversal of the installed battery polarity without said integrated circuits coming to any harm.

This demand also arises from a likelihood of errors occurring in the battery hook-up, and is intensified especially where the electric system includes power actuators for which no resistive components can be connected in the supply because such components are apt to bring down the supply voltage on account of the voltage drop thereacross.

To meet this demand, the prior art has proposed that a one-way component, specifically a diode, be used which is connected externally between the electronic control circuit and the positive supply pole to protect said integrated circuit in the event of the battery polarity being reversed.

While being advantageous cost-wise, this prior approach has drawbacks in that the voltage drop Vd across the diode brings down the voltage available to the electric load to be driven; in addition, the system efficiency deteriorates because the dissipated power is increased by an amount equal to the voltage VD on the diode multiplied by the current I1 that flows through the load.

The technical problem underlying this invention is to provide an integrated circuit which has such structural and performance characteristics as to obviate the cited drawbacks with which the prior art is beset.

This problem is solved by a circuit as indicated comprising:

a first DMOS power transistor connected with its source electrode side to an electric load to be driven toward ground;

a second, protective DMOS transistor connected with its source electrode side to a positive pole of the battery, and with its drain electrode side to the drain electrode of said first transistor;

said first and second transistors having the drain region in common.

The features and advantages of a circuit according to the invention will become more clearly apparent from the following detailed description of an embodiment thereof, given by way of example and not of limitation with reference to the accompanying drawings.

Figure 1:
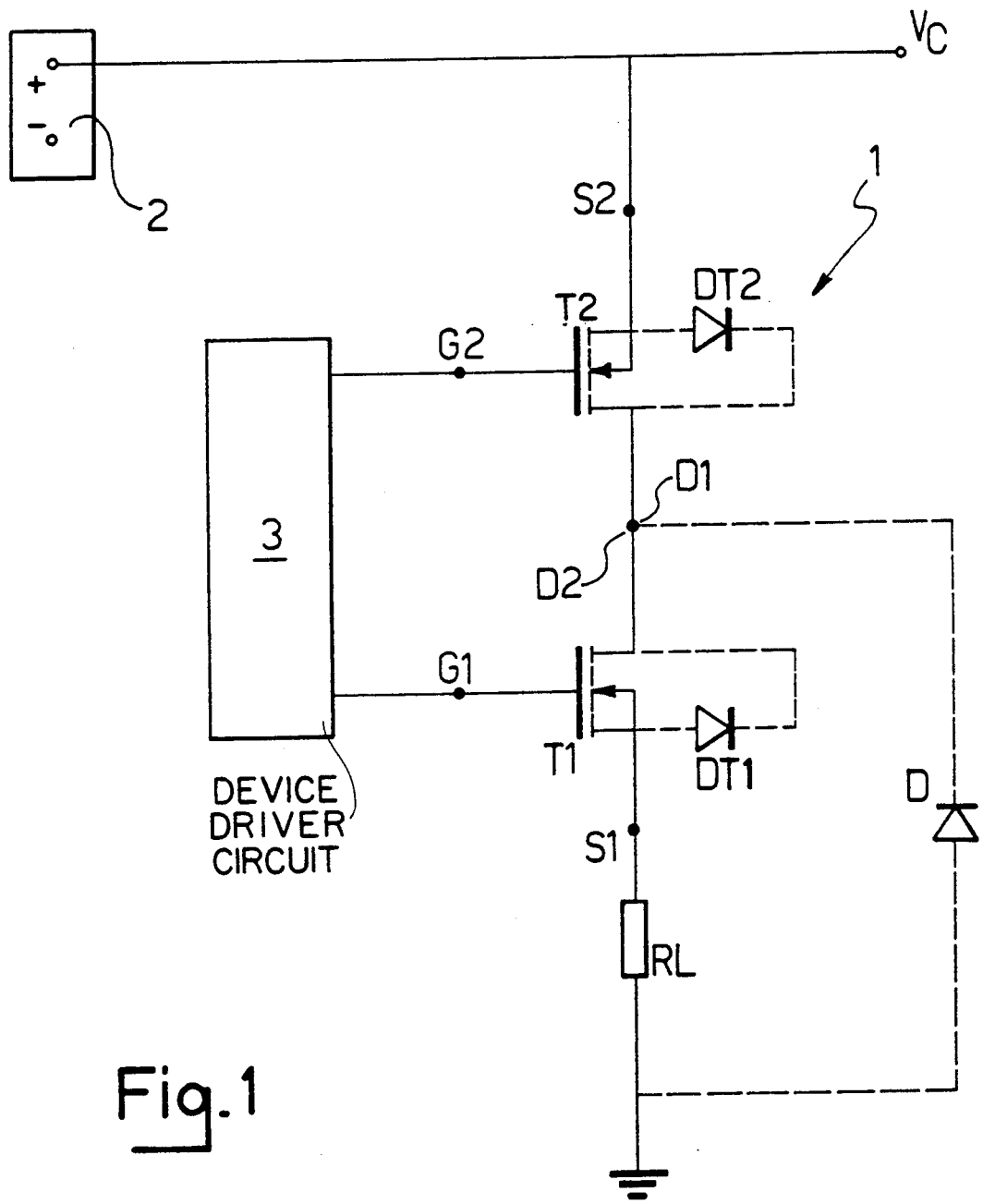
FIG. 1 is a wiring diagram of the integrated circuit according to the invention.

With reference to the drawing views, generally and schematically shown at 1 is a circuit which is self-protected against reversal of the polarity of a storage battery 2. The circuit 1 is expediently in the form of an integrated circuit.

The circuit 1 comprises a first power transistor T1 of the DMOS type which is connected with its source electrode side to an electric load RL to drive said load toward ground.

More specifically, the transistor T1 has its source S1 connected to one end of said load RL which has the other end connected to ground.

The circuit 1 further comprises a second, protective transistor T2, also of the DMOS type, which is connected between a positive pole Vc of the battery 2 and the first transistor T1. The source S2 of that transistor T2 is connected to said pole Vc, whereas the gate electrodes G1, G2 of the transistors T1, T2 are respectively connected to corresponding outputs of a circuit portion 3 driving the circuit 1.

Advantageously, the respective drain regions D1 and D2 of the transistors T1 and T2 are shared in common and formed on a single polarity pod N (in the instance of an N-channel DMOS) in the semiconductor substrate with P polarity of that integrated structure.

Each transistor includes, moreover, a corresponding intrinsic diode DT1 and DT2 which is connected in each transistor between the drain and the source and forward biased to the source. Furthermore, between the common drain D1, D2 of said transistors and the substrate there is provided a parasitic diode D forward biased to the substrate.

Figure 2:
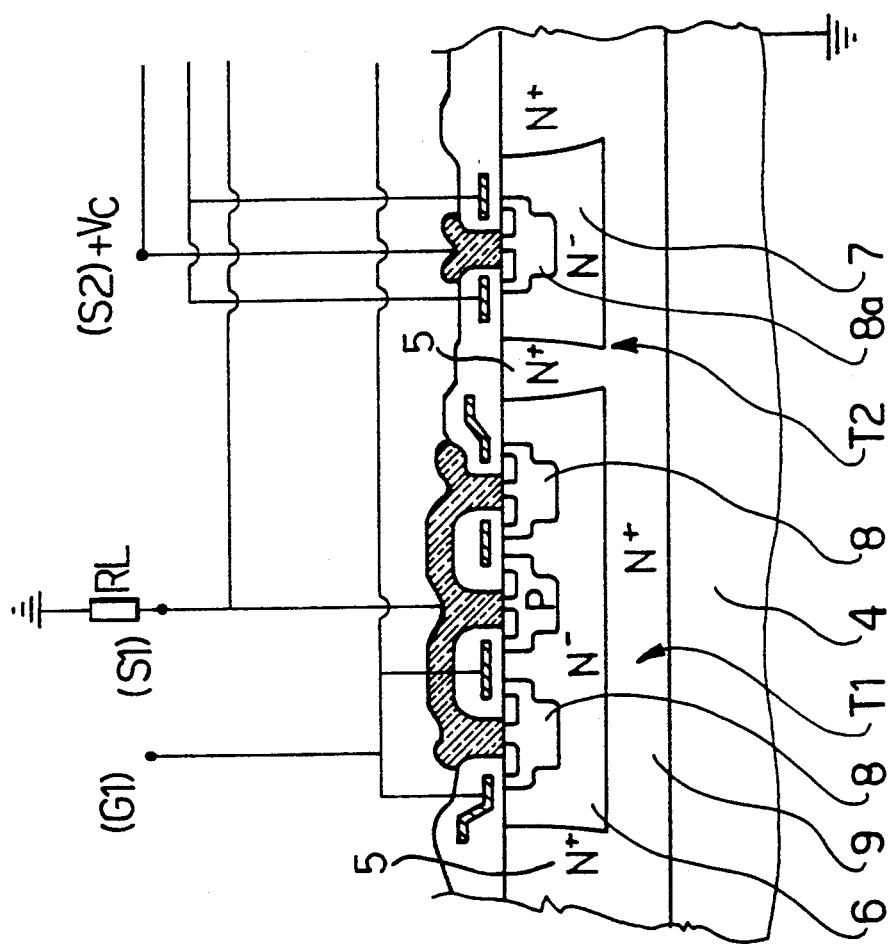
FIG. 2 is a side elevation cross-sectional view showing schematically the structure of the integrated circuit according to the invention.

More specifically, there is shown in the example according to FIG. 2 the structure of the transistors T1 and T2 which are, in a preferred embodiment, a vertical high voltage (VDMOS) DMOS transistor and a lateral low voltage (LDMOS) DMOS transistor, interlaid with each other.

It may be appreciated from FIG. 2 that in a semiconductor substrate 4 slightly doped with P-type impurities, there is formed a buried layer 9 doped oppositely from the substrate, being in particular of the N+ type, which constitutes the low resistivity portion of said drain region D1-D2 shared by both of said transistors T1 and T2.

Over the epitaxially grown, buried layer 9, there are formed the transistor common drain D1, D2 regions 6 and 7 being doped N- alike but with a lower dopant concentration than the buried layer 9, in which conventional zones 8 and 8a, also referred to as source cells, are formed.

Thus, the circuit of this invention is formed by alternating so-called source cells 8 of a vertical DMOS transistor T1 with source cells 8a of a lateral DMOS transistor T2, the latter having a lower specific series resistance than the former.

High-doped N+ regions 5, also referred to as fingers, are provided which, by connecting the N+ buried layer 9 of the vertical DMOS to the surface in the proximities of the lateral DMOS fingers, form a low resistivity path for the flow of electrons which is picked up by the LDMOS from the VDMOS.

Whenever the supply voltage Vc is applied, the second transistor T2 will be in conduction and protect the integrated circuit 1 in which the power actuator T1 is connected in all those cases when the polarity of the storage battery 2 has been reversed.

With the device driver 3 in operation, a current I1 is flown through the load RL which is supplied from the first transistor T1 via the second, protection transistor T2.

Upon the battery polarity being reversed, the second transistor will break and protect, therefore, both the driver and the load RL. This results because the drain-to-gate voltage of the second transistor T2 equals in negative value the voltage drop Vgs between the gate G2 and the source S2, so the second transistor T2 becomes operative as a Zener power diode protecting the integrated circuit 1.

Advantageously, the voltage drop V across the second transistor can be made as small as desired by appropriate driving of the gate electrode, since that voltage is the product of the inherent resistance of the transistor T2 by the load current I1 flown therethrough. In view of the value of that resistance being inversely proportional to the silicon surface area occupied by the second transistor in the integrated circuit 1, the resistance can be made quite small by increasing the surface area occupied by the transistor and correspondingly reducing the voltage drop thereacross as well as the dissipation of electric power.

Furthermore, the combination of a vertical DMOS transistor with a lateral DMOS transistor, respectively for a high and low voltage, enables the circuit to adequately withstand both reversals of the battery polarity, which would in all cases have a low voltage value in the 12-24 Volts range, and any dumping operational conditions apt to induce voltage peaks as high as 60 Volts.

A further benefit is that the circuit of this invention can maximize the performance of the transistors incorporated thereto, especially in terms of the overall resistive drop, thereby the silicon surface area required for integration can be minimized. The drain regions are formed in the same pod or region, and accordingly, the two transistors do not require to be isolated on separate pods and waste useful area.

Figure 3:
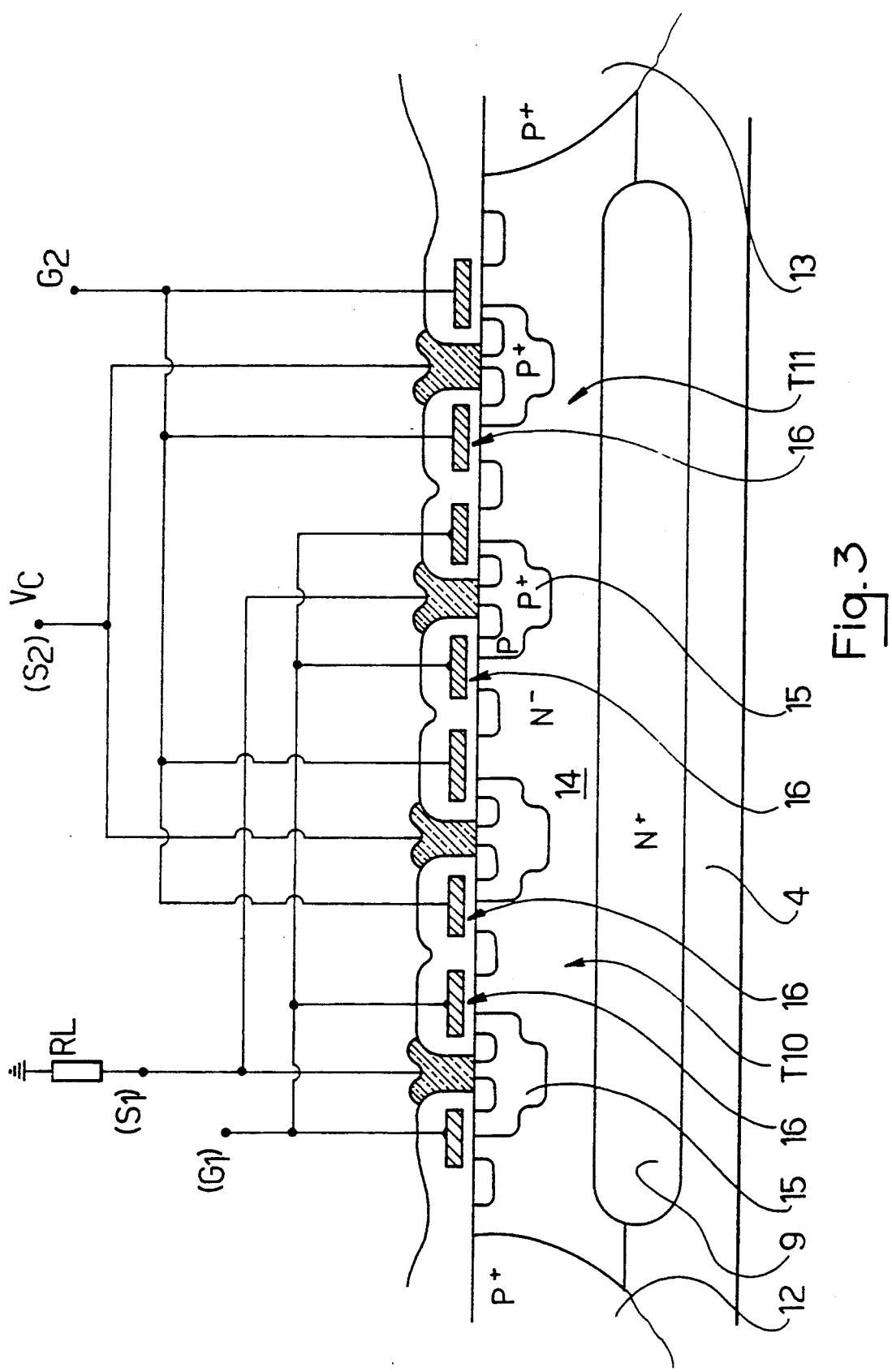
FIGS. 3 and 4 are respective side elevation cross-sectional views showing schematically modified embodiments of the circuit of FIGS. 1 and 2.

With specific reference to the example shown in FIG. 3, a modified embodiment of the inventive circuit will be now described in which cooperating items and parts which are structured and operate similarly to the preceding embodiment are designated by the same reference numerals.

This variant is particularly useful where the circuit 1 is not required to withstand dumping operational conditions.

In this variant, the circuit 1 comprises a pair of interlaid low voltage lateral transistors T10 and T11 of the DMOS type.

More specifically, in a semiconductor substrate 4 which is P-doped slightly, there is provided a buried layer 9 doped N+ oppositely from the substrate, which bounds, in cooperation with opposing lateral regions 12 and 13 having a higher concentration of the same P-type dopant as the substrate, a pod 14 doped N- which is adapted to form the drain region shared by both transistors T10 and T11 in common.

Formed on said pod 14 are also conventional source regions 15 alternating with gates 16 as is typical of the structure of lateral DMOS transistors.

Figure 4:
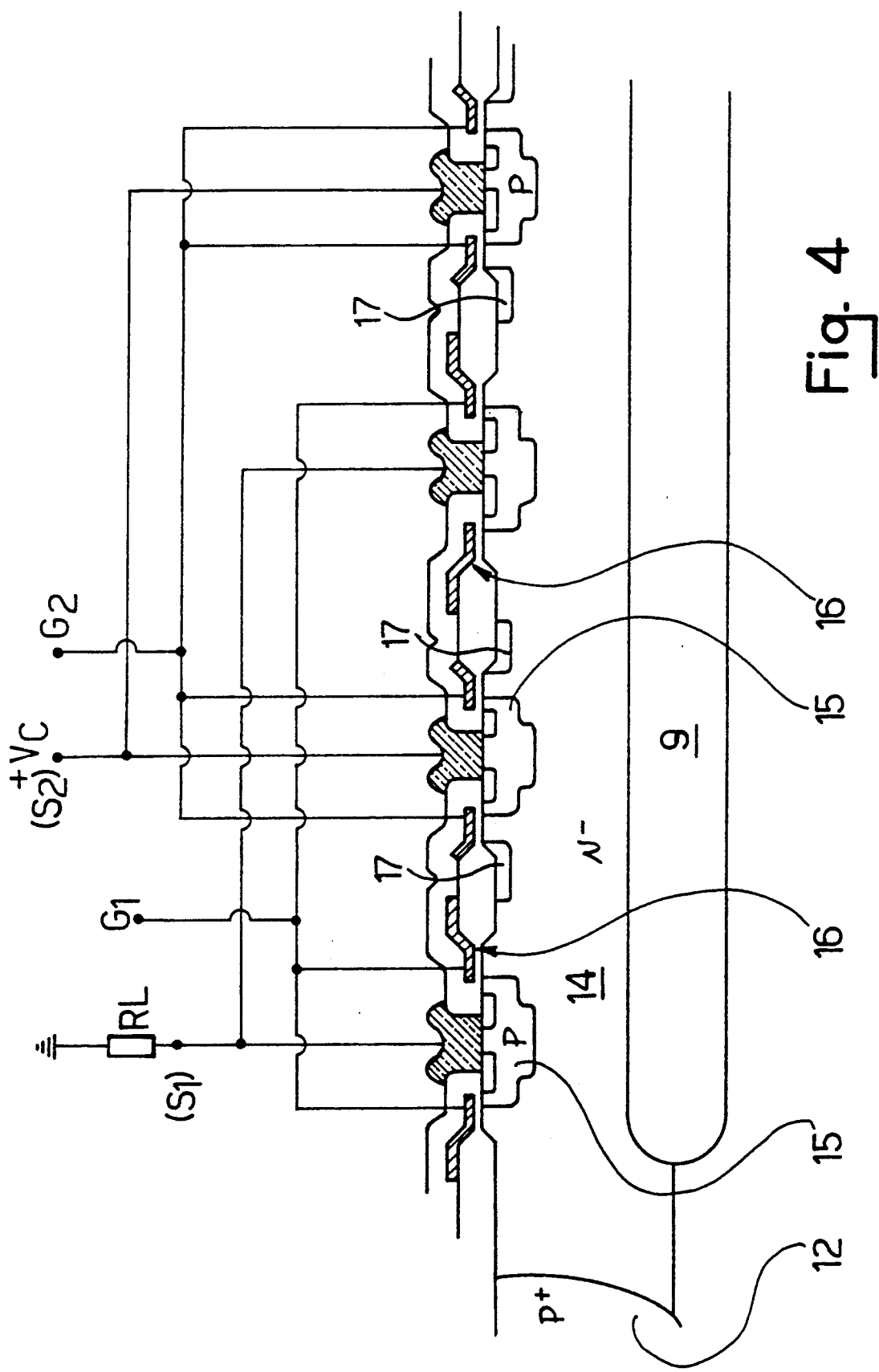

In a further modified embodiment, as shown in FIG. 4, the circuit 1 may be constructed by associating a pair of lateral DMOS transistors having gate regions with several extensions which serve substantially field plate functions. Using the planos technique, in fact, the gate electrode made of polycrystalline silicon can be extended and spread over the field oxide to provide a lateral DMOS transistor adapted to withstand high voltages. Conversely, by reducing the spread of the gate electrode over the field oxide, a lateral DMOS transistor can be obtained for low voltages.

Furthermore, to reduce the resistive path between adjacent sources, using the locos technique to provide the field oxide, a high-doped zone 17 of the N+ type is introduced by ion implantation which is self-aligned to the field oxide on the side of the low voltage LDMOS transistor.

The circuit of the above-discussed variants operates in the same manner as the embodiment described first, to substantially bring about the same advantages.

We claim:

1. An integrated circuit self-protected against a reversal of its supply battery polarity, characterized in that it comprises a first DMOS power transistor connected with its source electrode side to an electric load to be driven toward ground, and a second, protective DMOS transistor connected with its source electrode side to a positive pole of the battery and with its drain electrode side to the drain electrode of said first transistor, said first and second transistors having the drain region in common.

2. A circuit according to claim 1, characterized in that said first transistor is a DMOS transistor of the vertical type.

3. A circuit according to claim 1, characterized in that said first transistor is a high voltage lateral DMOS transistor.

4. A circuit according to claim 2, characterized in that said second transistor is a lateral DMOS transistor.

5. A circuit according to claim 4, characterized in that the integrated circuit comprises at least one region of N+ polarity fingers between said vertical DMOS transistor and said second lateral DMOS transistor in the common drain region to lower the circuit specific series resistance.

6. A circuit according to claim 4, characterized in that the integrated circuit comprises at least one N+ doped region self-aligned to a field oxide on the side of said second lateral DMOS transistor to lower the circuit specific series resistance.

7. An integrated circuit self-protected against a reversal of its supply battery polarity, comprising a first MOS power transistor having source and drain electrodes, and a second protective MOS transistor having source and drain electrodes, means for connecting the first transistor source electrode to an electrical load connected to ground, means for connecting the second transistor source electrode to a pole of the battery, means for connecting the second transistor drain electrode to the first transistor drain electrode, said first and second transistors being located in the same semiconductor substrate.

8. A circuit according to claim 7, wherein said first transistor is a DMOS vertical transistor, said second transistor is a DMOS lateral transistor, and the first and second transistor drain electrodes share a common region of the substrate.

9. A circuit according to claim 7, further comprising means to lower the specific series resistance of the second transistor.

* * * * *